US010796942B2

(12) United States Patent
Mariani et al.

(10) Patent No.: US 10,796,942 B2
(45) Date of Patent: Oct. 6, 2020

(54) SEMICONDUCTOR STRUCTURE WITH PARTIALLY EMBEDDED INSULATION REGION

(71) Applicant: STMICROELECTRONICS S.r.l., Agrate Brianza (IT)

(72) Inventors: Simone Dario Mariani, Vedano al Lambro (IT); Fabrizio Fausto Renzo Toia, Busto Arsizio (IT); Marco Sambi, Cornaredo (IT); Davide Giuseppe Patti, Mascalucia (IT); Marco Morelli, Bareggio (IT); Giuseppe Barillaro, Pisa (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 16/105,403

(22) Filed: Aug. 20, 2018

(65) Prior Publication Data
US 2020/0058540 A1 Feb. 20, 2020

(51) Int. Cl.
  *H01L 29/78* (2006.01)
  *H01L 21/762* (2006.01)
  *H01L 21/02* (2006.01)
  *H01L 21/306* (2006.01)
  *H01L 29/06* (2006.01)

(52) U.S. Cl.
  CPC .. *H01L 21/76213* (2013.01); *H01L 21/02164* (2013.01); *H01L 21/02203* (2013.01); *H01L 21/02238* (2013.01); *H01L 21/306* (2013.01); *H01L 29/0649* (2013.01); *H01L 29/7824* (2013.01)

(58) Field of Classification Search
  None
  See application file for complete search history.

(56) References Cited

U.S. PATENT DOCUMENTS

| | | | |
|---|---|---|---|
| 4,810,667 A * | 3/1989 | Zorinsky | H01L 21/76264 257/E21.564 |
| 4,819,037 A | 4/1989 | Sakakibara et al. | |
| 5,621,239 A * | 4/1997 | Horie | H01L 21/76251 257/347 |
| 5,801,089 A | 9/1998 | Kenney | |
| 5,863,826 A | 1/1999 | Wu et al. | |
| 6,037,634 A * | 3/2000 | Akiyama | H01L 27/1203 257/347 |
| 6,331,456 B1 | 12/2001 | Wu | |

(Continued)

FOREIGN PATENT DOCUMENTS

EP 1 098 355 A1 5/2001

OTHER PUBLICATIONS

Gharbi, "Development of a New Process for Electrical Isolation of ULSI CMOS Circuits based on Local Anodization of Silicon," doctoral thesis, National Institute of Applied Science of Lyon, Lyon, France, 2011, pp. 1-117. (139 pages) (with English Translation).

*Primary Examiner* — Bilkis Jahan
(74) *Attorney, Agent, or Firm* — Seed IP Law Group LLP

(57) ABSTRACT

A technique to make silicon oxide regions from porous silicon and related semiconductor structures are disclosed. The porous silicon is made in situ by anodizing P doped silicon regions. Thus, the shape and profile of the oxide regions may be controlled by controlling the shape and profile of the P doped silicon regions.

20 Claims, 12 Drawing Sheets

(56) References Cited

U.S. PATENT DOCUMENTS

| | | | |
|---|---|---|---|
| 2005/0181536 A1* | 8/2005 | Tsuji | H01L 29/045 438/105 |
| 2007/0278594 A1* | 12/2007 | Takahashi | H01L 27/0629 257/379 |
| 2008/0079009 A1* | 4/2008 | Yaegashi | H01L 21/0262 257/77 |
| 2008/0171420 A1 | 7/2008 | Yang et al. | |
| 2011/0180806 A1* | 7/2011 | Hebert | H01L 21/76281 257/76 |
| 2016/0064539 A1* | 3/2016 | Lu | H01L 29/66462 257/76 |
| 2017/0250253 A1* | 8/2017 | Toia | H01L 21/02381 |

\* cited by examiner

SEMICONDUCTOR STRUCTURE WITH PARTIALLY EMBEDDED INSULATION REGION

BACKGROUND

Technical Field

The present disclosure relates to semiconductor devices and technologies with various oxide layers for insulation.

Description of the Related Art

Mixed signal integrated circuits ("IC") combine analog circuitry with digital circuitry. Devices of digital circuitry (digital devices) are subject to low electric current and voltages, and function as switches to achieve logical or arithmetic functions, among other things. Devices of analog circuitry (analog devices) may be exposed directly to high voltage scenarios of input voltage or current signals, power regulation and amplification, and power sensing.

Merged bipolar-CMOS-DMOS processes ("BCD") have been used to fabricate mixed signal ICs. Due to the differences in the signal or working regimens of the bipolar devices, CMOS devices and DMOS, such as BCD structures, include complex processes to form various insulation regions to isolate the various devices. Generally a BCD device includes shallow trench isolation ("STI"), deep trench isolation ("DTI"), and field oxide isolation regions, like local oxidation of silicon ("LOCOS"), e.g., $SiO_2$. Conventionally, complex processes are used to form DTI and STI in a same wafer. Further, due to the $SiO_2$ growth characteristics under the thermal oxidation of silicon process, the shapes of the LOCOS area are limited.

BRIEF SUMMARY

Embodiments of the present disclosure are directed to techniques to make embedded silicon oxide regions from porous silicon. The porous silicon is made in situ by anodizing a P doped silicon region. Thus, a shape and profile of the oxide region may be controlled by controlling a shape and profile of the P doped silicon region. It is much easier to control the shape and profile of a P doped region by, e.g., controlling the doping conditions than controlling the shape and profile of $SiO_2$ in a local oxidation process. As such, techniques of the present disclosure can achieve unique oxide region structures that are not possible or feasible to obtain through traditional solutions.

For example, a structure includes an oxide region and a semiconductor region embedded within the oxide region, with only a top surface exposed. Specifically, the oxide region is cup-shaped and is adjacent to the embedded semiconductor region by the sidewall(s) and the bottom surface thereof. Only the top surface of the embedded semiconductor region is not surrounded by the oxide region.

In another example, an oxide region is formed adjacent to a semiconductor region by the bottom surface and part of the sidewall(s) of the semiconductor region. As such the semiconductor region laterally contacts other elements only through an opening defined by the oxide region.

Such unique shapes or profiles of oxide regions may be used in semiconductor devices to reduce the intrinsic parasitic N—P—N heterojunctions and o achieve local isolation of a single device or a circuit unit from the rest of the circuitry. Such local dielectric isolation by the oxide regions formed through the disclosed technique may achieve the advantages of a silicon-on-insulator substrate in a more versatile silicon substrate, which simplifies the design and fabrication of a mixed signal IC or other SOC, e.g., a bipolar-CMOS-DMOS (BCD) IC.

BRIEF DESCRIPTION OF THE SEVERAL VIEWS OF THE DRAWING(S)

For an understanding of embodiments of the present disclosure, reference is made, by way of example, to the enclosed drawings, wherein.

DETAILED DESCRIPTION

Each of the features and teachings disclosed herein may be utilized separately or in conjunction with other features and disclosure to provide methods for achieving local oxidation from porous silicon and for obtaining various distinctive structures that are enabled by the methods. Representative examples utilizing many of these additional features and teachings, both separately and in combination, are described in further detail with reference to the attached figures. This detailed description is intended to teach a person of skill in the art further details for practicing aspects of the present disclosure, and is not intended to limit the scope of the claims. Therefore, combinations of features disclosed in the detailed description may not be necessary to practice the teachings in the broadest sense, and are instead disclosed merely to describe particularly representative examples of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, and third does not necessarily imply a ranked sense of order, but rather may only distinguish between multiple instances of an act or structure.

Reference throughout this specification to "one example" or "an example" means that a particular feature, structure or characteristic described in connection with the example is included in at least one example. Thus, the appearances of the phrases "in one example" or "in an example" in various places throughout this specification are not necessarily all referring to the same example. Furthermore, the particular features, structures, or characteristics may be combined in any suitable manner in one or more examples.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1A:
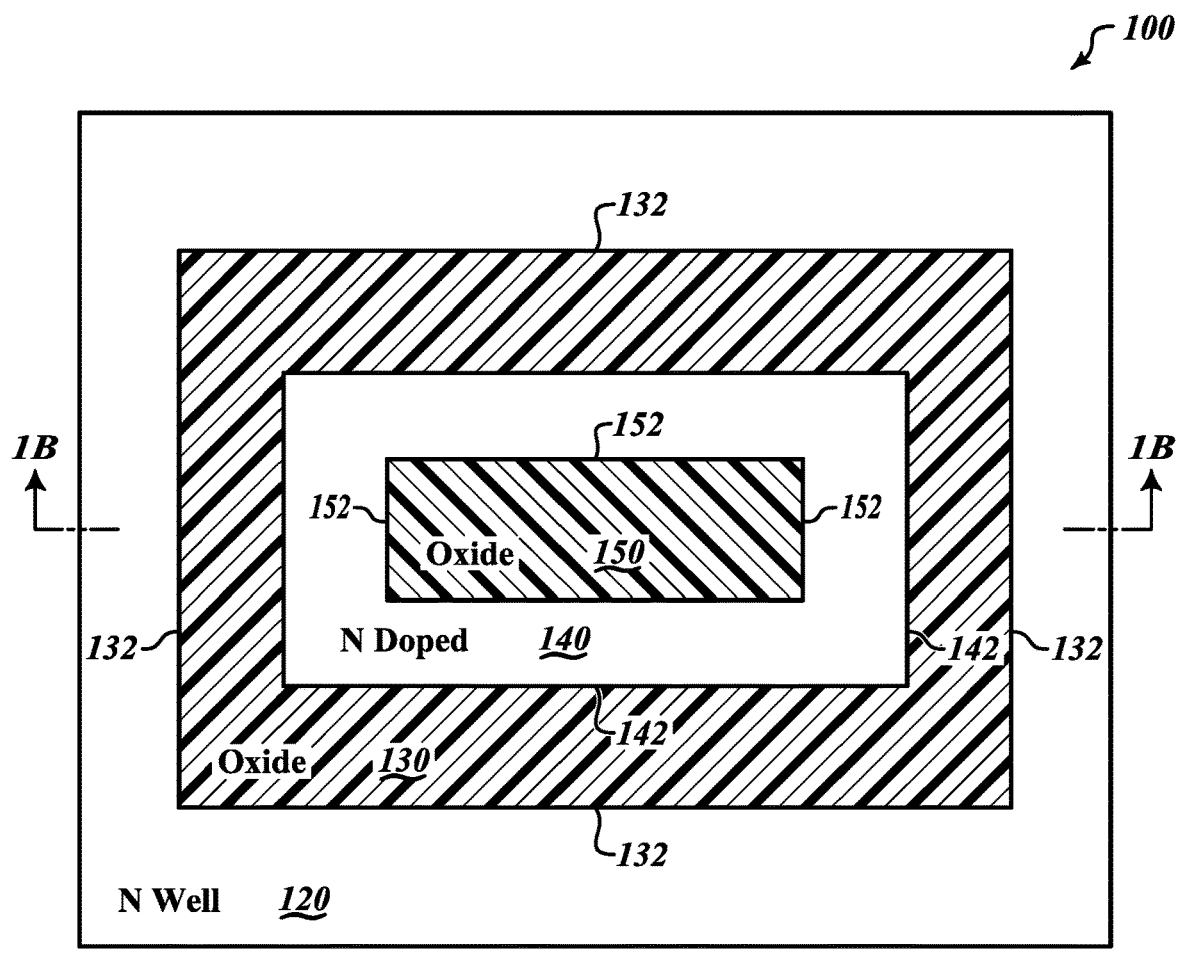
FIGS. 1A and 1B show views of a first example structure according to the disclosure.
Figure 1B:
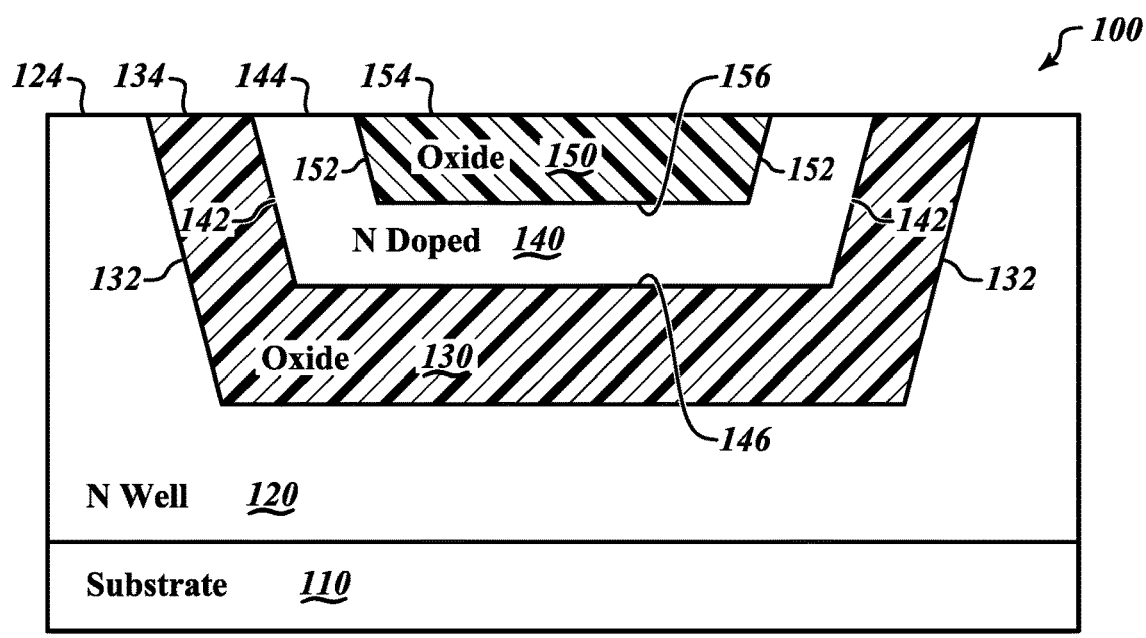

FIG. 1A shows a top view of an example structure 100, and FIG. 1B shows a cross-sectional view of the example structure 100, taken from cutting line 1B-1B. Referring to FIGS. 1A and 1B together, structure 100 includes a substrate 110, for example a silicon substrate and an N type well or N type epitaxial layer 120, referred to herein as N well 120, for an illustrative example, over the substrate 110 and/or embedded within the substrate 110. The N type well 120 may be formed through a deep implant process of N type impurities, like phosphorus (P), arsenic (As), or antimony (Sb).

The substrate 110 may include a silicon substrate in crystalline structure and/or other elementary semiconductors like germanium. Alternatively or additionally, substrate 110 may include a compound semiconductor such as silicon carbide, gallium arsenide, indium arsenide, and/or indium phosphide. Further, substrate 110 may also include a silicon-on-insulator (SOI) structure. The substrate 110 may include an epitaxial layer and/or may be strained for performance enhancement. The substrate 110 may also include various doping configurations depending on design requirements such as P type substrate and/or N type substrate and various doped regions such as P wells and/or N wells. Further, the substrate 110 may be patterned to have a plurality of defined areas each having different epitaxial surface layers, and a silicon epitaxial area may be one of the epitaxial surface areas.

A first oxide region 130, e.g., of silicon oxide, is formed embedded within and over the N well 120. As shown in FIGS. 1A and 1B, all sidewalls 132 of the first oxide region 130 are enclosed within the N well 120. FIGS. 1A and 1B show, as an illustrative example, that the first oxide region 130 includes four sidewalls 132, which is not limiting. The first oxide region 130 may include a number of sidewalls 132 in a regular shape or irregular shape, and the first oxide region 130 may include just one continuous sidewall 132, which are all included in the disclosure. An upper surface 134 of the first oxide region 130 is exposed from the N well 120.

An N doped region 140 is formed embedded within and over the first oxide region 130. As shown in FIGS. 1A and 1B, all sidewalls 142 of the N doped region 140 are enclosed within the first oxide region 130. FIGS. 1A and 1B show, as an illustrative example, that the N doped region 140 includes four sidewalls 142, which is not limiting. The N doped region 140 may include a number of sidewalls 142 in a regular shape or an irregular shape, and the N doped region 140 may include just one continuous sidewall 142, which are all included in the disclosure. In an embodiment, the N doped region 140 may be more heavily doped than the N well 120, which is not limiting. An upper surface 144 of the N doped region 140 is exposed from the first oxide region 130. The first oxide region 130 surrounds or is adjacent to a bottom surface 146 of the N doped region 140. That is, the first oxide region 130 fully surrounds or wraps around the N doped region 140 except for the upper surface 144 of the N doped region 140.

A second oxide region 150, e.g., of silicon oxide, is formed embedded within and over the N doped region 140. As shown in FIGS. 1A and 1B, all sidewalls 152 of the second oxide region 150 are enclosed within the N doped region 140. FIGS. 1A and 1B show, as an illustrative example, that the second oxide region 150 includes four sidewalls 152, which is not limiting. The second oxide region 150 may include a number of sidewalls 152 in a regular shape or an irregular shape, and the second oxide region 150 may include just one continuous sidewall, which are all included in the disclosure. An upper surface 154 of the second oxide region 150 is exposed from the N doped region 140. The N doped region 140 surrounds or is adjacent to a bottom surface 156 of the second oxide region 150. That is, the N doped region 140 fully surrounds or wraps around the second oxide region 150 except for the upper surface 154 of the second oxide region 150.

In an embodiment, each of the surfaces, surface 134 of the oxide region 130, surface 144 of the N-doped region, and surface 154 of the oxide region 150, are coplanar with one another and coplanar with a surface 155 of the N well 120.

Figure 2A:
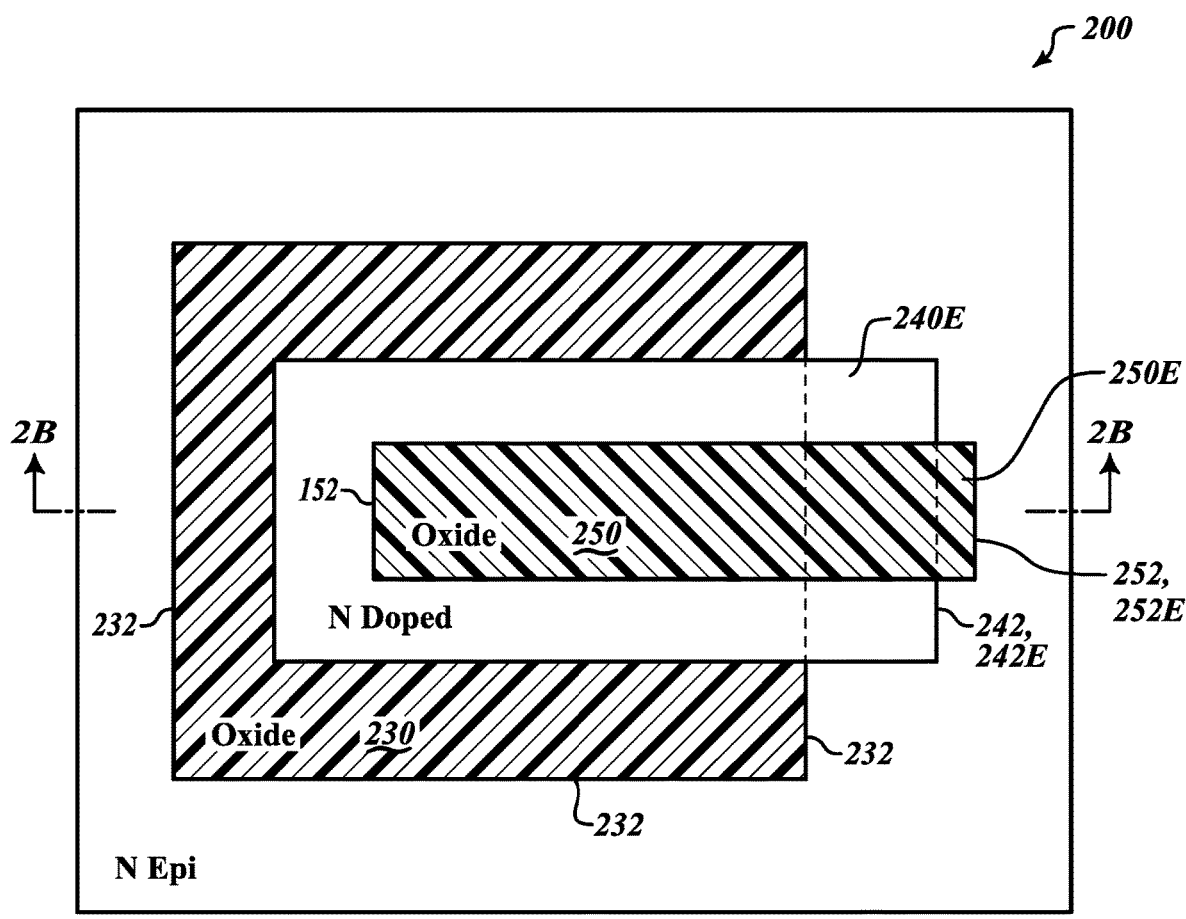
FIGS. 2A and 2B show views of a second example structure according to the disclosure.
Figure 2B:
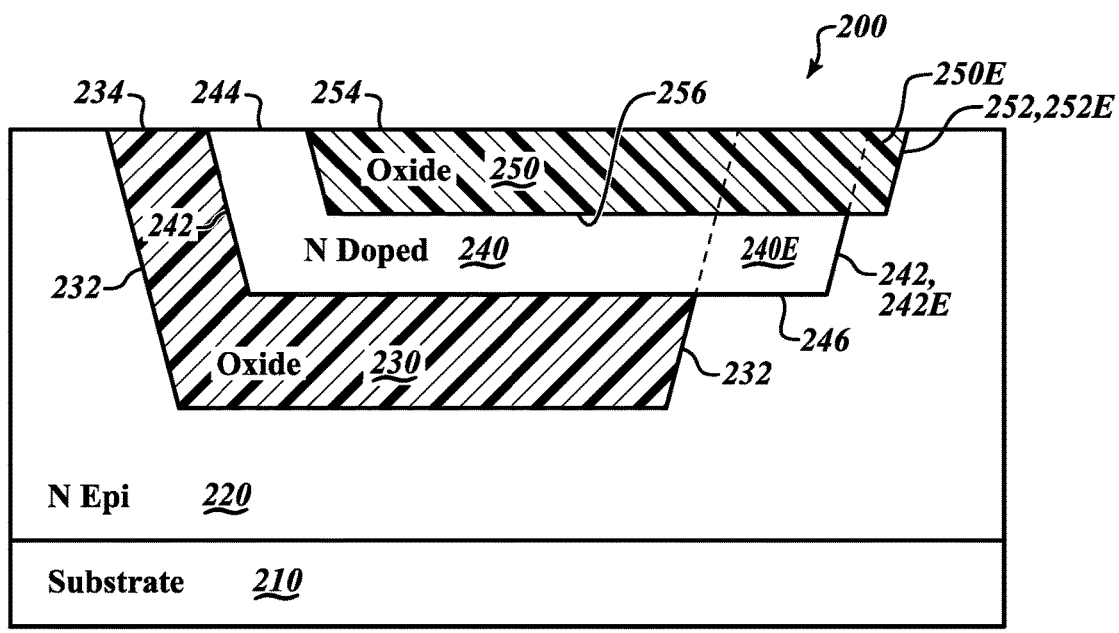

FIG. 2A shows a top view of another example isolation structure 200 and FIG. 2B shows a cross-sectional view of the example structure 200, taken from cutting line 2B-2B. Referring to FIGS. 2A and 2B together, the structure 200 includes a substrate 210, which may be similar to the substrate 110 of FIGS. 1A, 1B.

An N type epitaxial layer or N well 220, referred to herein as N epitaxial layer, is formed over the substrate 210. In another embodiment, the N well 220 may be embedded within the substrate 210. An N type epitaxial layer may be formed through doping of N type impurities like phosphorus (P), arsenic (As), or antimony (Sb).

A first oxide region 230, e.g., of silicon oxide, is formed embedded within and on the N epitaxial layer 220. As shown in FIGS. 2A and 2B, all sidewalls 232 of the first oxide region 230 are enclosed within the N epitaxial layer 220. FIGS. 2A and 2B show, as an illustrative example, that the first oxide region 230 includes four sidewalls 232, which is not limiting. The first oxide region 230 may include any number of sidewalls 232 in a regular shape or an irregular shape, and the first oxide region 230 may include just one continuous sidewall 232, which are all included in the disclosure. An upper surface 234 of the first oxide region 230 is exposed from the N type epitaxial layer 220.

An N doped region 240 is formed partially embedded within and over the first oxide region 230. As shown in FIGS. 2A and 2B, a portion 240E of the N doped region 240 is outside of or extends beyond the first oxide region 230, past the sidewall 232. At least one sidewall 242 or a part 242E of a sidewall 242 of the N doped region 240 extends beyond the first oxide region 230. FIGS. 2A and 2B show, as an illustrative example, that the N doped region 240 includes four sidewalls 242, which is not limiting. The N doped region 240 may include any number of sidewalls 242 in a regular shape or an irregular shape, and the N doped region 240 may include just one continuous sidewall, which are all included in the disclosure. In an embodiment, the N doped region 240 may be more heavily doped than the N epitaxial layer 220, which is not limiting. The portion 240E of the sidewall 242 is not surrounded by the oxide region 230, and is in contact with the N epitaxial layer 220.

An upper surface 244 of the N doped region 240 is exposed from the first oxide region 230. The first oxide region 230 at least partially surrounds or is adjacent to a bottom surface 246 of the N doped region 240, and at least partially surrounds the sidewall 242 of the N doped region 240. In an embodiment, the first oxide region 230 at least partially surrounds or is adjacent to two opposing sidewalls 242 of the N doped region 240.

A second oxide region 250, e.g., of silicon oxide, is formed partially embedded within and over the N doped region 240. As shown in FIGS. 2A and 2B, a portion 250E of the second oxide region 250 is outside of or extends beyond the N doped region 240. At least one sidewall 252E or a part 252E of sidewall 252 of the second oxide region 250 is beyond the N doped region 240. FIGS. 2A and 2B show, as an illustrative example, that the second oxide region 250 includes four sidewalls 252, which is not limiting. The second oxide region 250 may include a number of sidewalls 252 in a regular shape or an irregular shape, and the second oxide region 250 may include just one continuous sidewall, which are all included in the disclosure. An upper surface 254 of the second oxide region 250 is exposed from the N doped region 240. The N doped region 240 at least partially surrounds or is adjacent to a bottom surface 256 of the second oxide region 250, and at least partially surrounds the sidewall 252 of the second oxide region 250. In an embodiment, the N doped region 240 at least partially surrounds or is adjacent to two opposing sidewalls 252 of the second oxide region 250.

The N well 120 and/or the N epitaxial layer 220 are provided in FIGS. 1A, 1B, 2A, and 2B as illustrative examples, and are not limiting. Similar structures of the first oxide region 130, 230, the N doped region 140, 240, and the second oxide region 150, 250 may be formed within a P type well or a P type epitaxial layer.

The various embodiments of the present disclosure include a substrate, such as substrate 210 in FIG. 2B. On the substrate is a first doped layer, such as the N well 220. These embodiments include a plurality of stacked layers, having a variety of shapes. The stacked layers alternate between insulation layers, like the oxide region 230, and doped layers, like N doped layer 240.

In FIG. 2B, the oxide region 230 is L-shaped in cross-section in FIG. 2B. The surface 234 is coplanar with a top surface of the N well 220. The N doped region 240 is also L-shaped, extending past the surface 232 of the oxide region 230. The final oxide region 250, that is on the N doped region 240, has a surface 252 that extends past a surface 242 of the N doped region 240.

Figure 3:
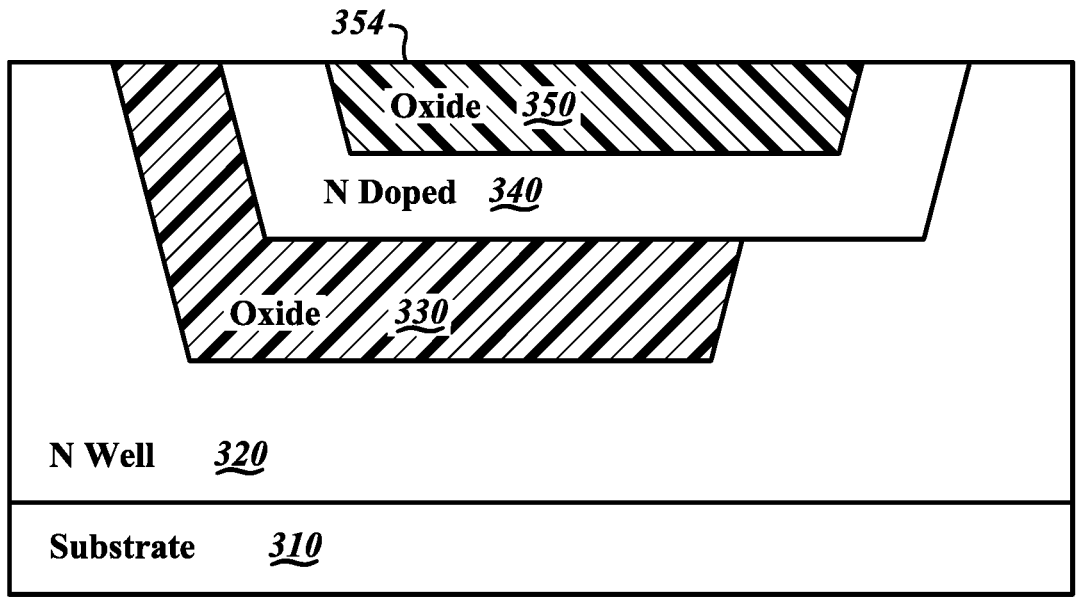
FIG. 3 shows a cross-sectional view of a third example structure according to the disclosure.

Further, the structures of FIGS. 1A, 1B, 2A, 2B, and the components and layers thereof, may be combined and re-arranged in various manners, and all are included in the disclosure. For example, as shown in FIG. 3, the N doped region 340 is partially embedded within the first oxide region 330 and the second oxide region 350 is fully embedded within the N doped region 340, except for the upper surface 354 of the second oxide region 350. Said differently, FIG. 3 includes a doped layer 320 on the substrate 310. There is an oxide region 330 on the doped layer 320, such that the oxide region 330 and the doped region 320 share a boundary. There is another doped region 340 on the oxide region 330. A portion of the doped region 340 shares a boundary with the oxide region 330 and another portion of the doped region 340 shares a boundary with the doped region 320, i.e. some of the sidewalls of the doped region 340 are exposed by the oxide region 330 to the doped region 320. The doped region 340 completely encapsulates or encloses sidewalls of the oxide region 350.

Figure 4:
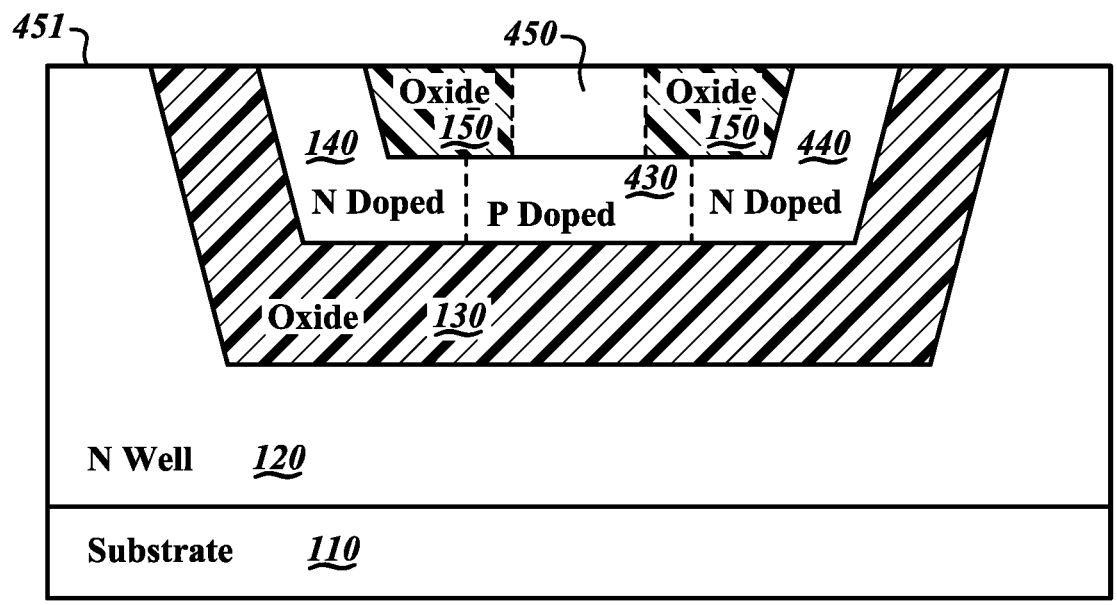
FIG. 4 shows a cross-sectional view of a fourth example structure according to the disclosure.

Further processes may be performed based on the structures of FIGS. 1A, 1B, 2A, and 2B to generate various structures. For example, as shown in FIG. 4, the N doped region 140 of the structure 100 of FIGS. 1A, 1B may be further processed, e.g., by counter-doping, to form a P doped region 430 and another N doped region 440, using any suitable approaches. An embedded gate structure 450 may be further formed within the second oxide region 150 and contacting the P doped region 430. For example, the embedded gate structure 450 may include a metal gate and a gate dielectric (not shown, for simplicity).

FIG. 4 includes a first doped region, such as N well 120, spaced from a second doped region (N doped 140, P doped 430, and N doped 440) by an oxide region 130. The second doped region includes three doped regions, which could house at least a channel region and possibly source and drain regions around the channel region. This transistor structure would result in a fully recessed transistor below a surface 451, which is a shared surface of an edge of the first doped region 120, the oxide region 130, the second doped region, the oxide regions 150, and the gate 450.

Figure 5A:
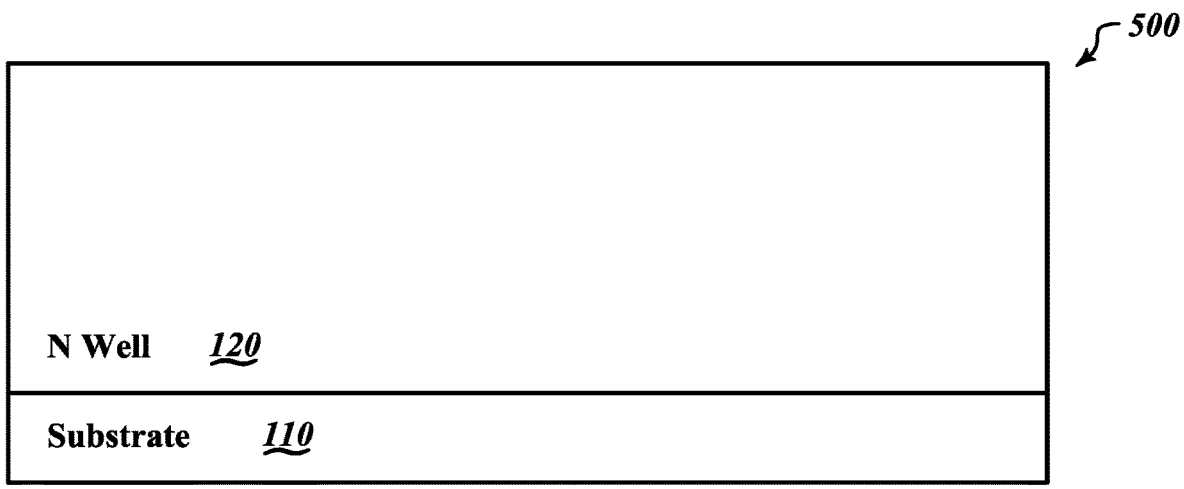
FIGS. 5A-5F show an example process to make the structure of FIGS. 1A, 1B according to the disclosure.

FIGS. 5A-5F illustrate an example process which can be used to make the structure 100 of FIGS. 1A and 1B. Referring now to FIG. 5A, a wafer 500 includes the substrate 110. The N type well ("N well") 120 is provided or formed in the substrate 110. A plurality of N wells 120 may be formed at various regions across the wafer 500 to form distinct isolation structures 100. The N well 120 includes silicon and N type impurities, like phosphorous. The N well 120 may be formed using any suitable techniques, and all are included in the disclosure. In an embodiment, the N well 120 is lightly doped.

Figure 5B:
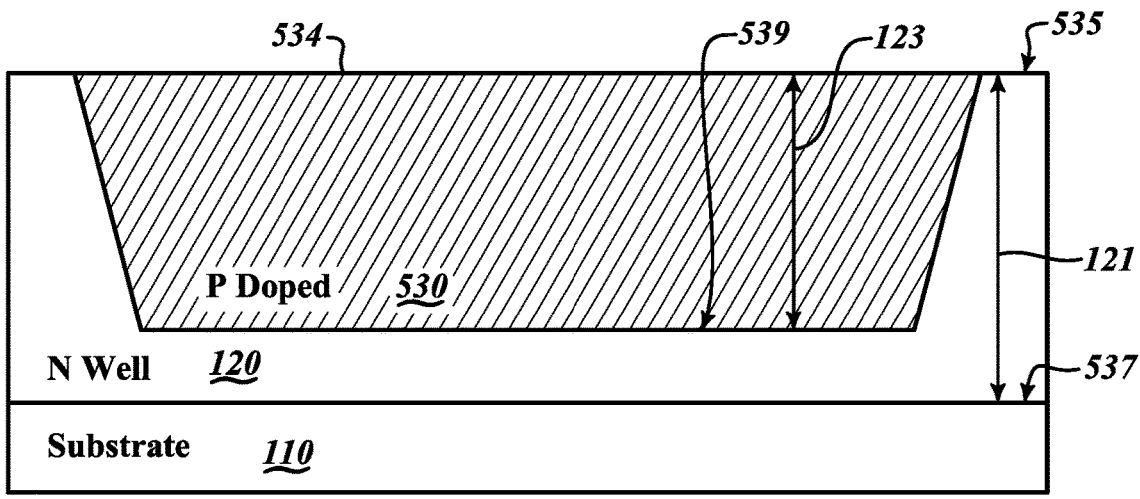

Referring to FIG. 5B, a first doped region 530 (a P doped region) is formed within the N well 120. The P doped region 530 may be formed by implantation of P type impurities, e.g., boron or boron-containing compounds like $BF_2$, or other suitable approaches through a selected surface area 534 of the N-well 120. A profile or shape of the first P doped area 530 may be controlled through the doping conditions, e.g., ion implantation temperature and energy, and may be determined based on design requirements.

The N well 120 has a first dimension 121 in a first direction, between a first surface 535 of the N Well and a second surface 537 of the N Well. The first P doped area 530 includes a second dimension 123 in the first direction, such as between the first surface 535 and a third surface 539. The second dimension 123 is less than the first dimension 121.

Figure 5C:
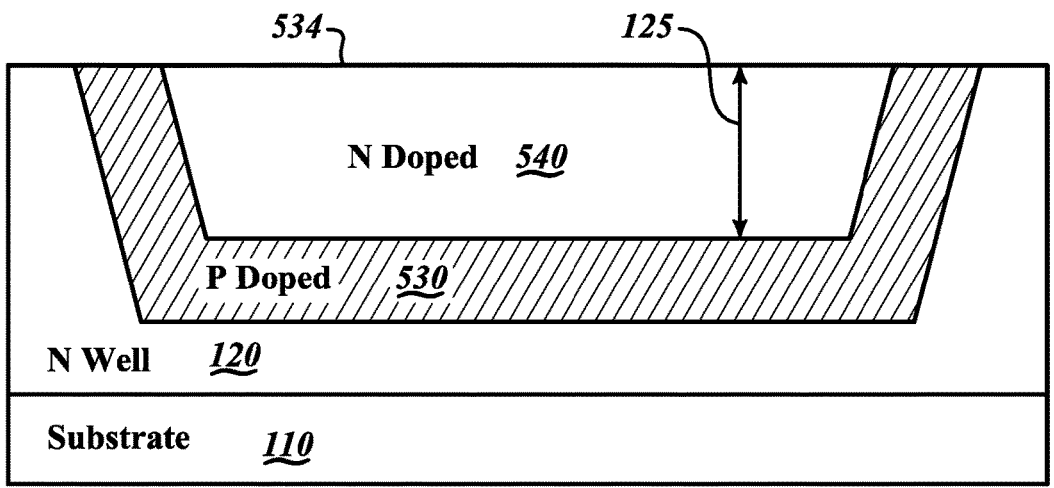

Referring to FIG. 5C, an N doped region 540 is formed within and over the P doped region 530 using, e.g., counter-doping, or other suitable approaches, through a selected surface area 544 of the P doped region 530. In an embodiment, the N doped region 540 is more heavily doped with the N type impurities, e.g., phosphorous, than the N well 120. Other doping approaches are also possible and included in the disclosure. The N doped region 540 includes a third dimension 125 in the first direction that is less than the second dimension 123.

Figure 5D:
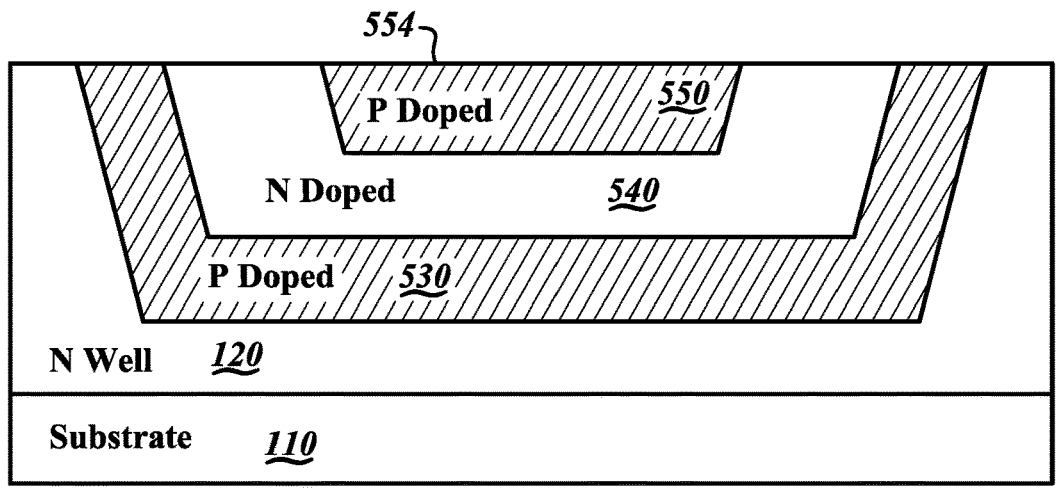

Referring to FIG. 5D, a second P doped region 550 is formed within and over the N doped region 540. The second P doped region 550 may be formed by counter-doping of P type impurities, e.g., boron or boron-containing compounds like $BF_2$, through a selected surface area 554 of the N doped region 540. Other suitable approaches to form the second P doped region 550 are also possible and included in the disclosure. For example, the second P doped region 550 may be a portion of the first P doped region 530, and the N doped region 540 may be formed through an angled implantation of N type impurities into the first P doped region 530, such that the N doped region 540 and the second P doped region 550, which is originally a portion of the first P doped region 530 separated by the N doped region 540, may be formed together. A profile or shape of the second P doped region 550 may be controlled through the doping conditions, e.g., ion implantation temperature and energy, and may be determined based on design requirements.

In the formation of each of the first P doped region (P doped region) 530, the N doped region 540, and the second P doped region (P counter-doped region) 550, an annealing process(es) may be performed to activate the dopants/impurities. Various approaches may be used to selectively activate or deactivate some portions within the first P doped region 530, the N doped region 540, and/or the second P doped region 550 to structure the shapes and/or profiles thereof and/or to meet design requirements, which are all included in the disclosure.

Figure 5E:
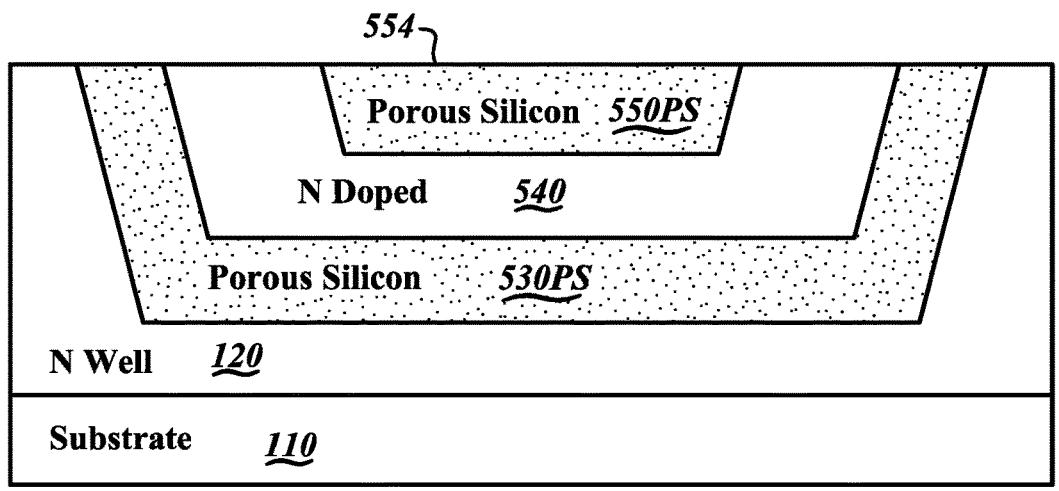

Referring to FIG. 5E, an anodization process is performed on the first P doped region 530 and the second P doped region (P counter-doped region) 550 to form porous silicon in the first P doped region 530 and the second P doped region 550. The anodization may use hydrogen fluoride (HF) solution or other alcoholic solvents. The anodization process may be controlled to convert the entire first P doped region 530 and/or the entire second P doped region 550 into porous silicon, or may convert portions thereof into porous silicon, which are all included in the disclosure. Other processes to form porous silicon from or using the P doped silicon in the first P doped region 530 and/or the second P doped region 550 are also possible and included in the disclosure. The first P doped region 530 and the second P doped region 550 are, thus, referred to as porous silicon regions 530PS, 550PS, respectively.

Figure 5F:
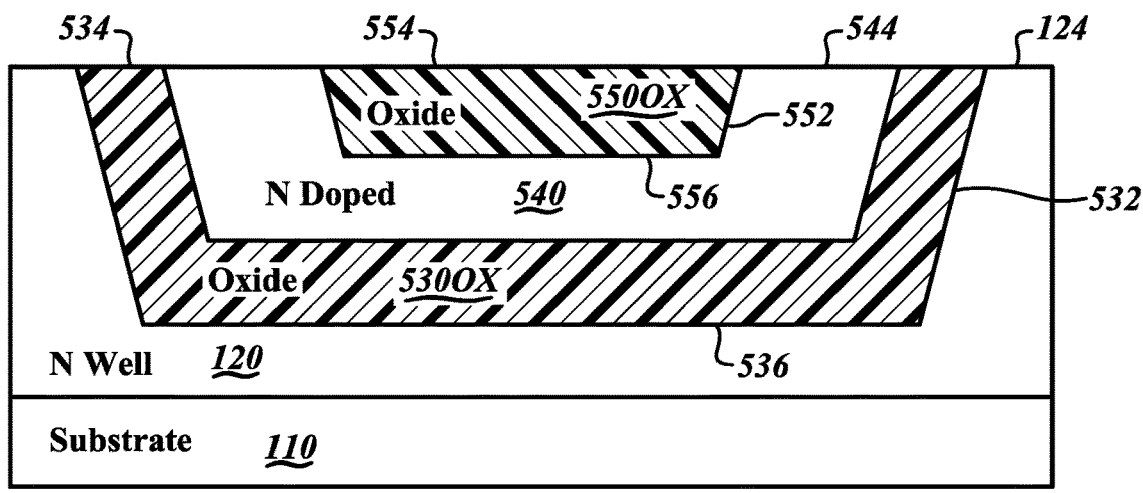

Referring to FIG. 5F, the porous silicon in the porous silicon regions 530PS, 550PS is oxidized to form first and second oxide regions 530OX, 550OX using suitable oxidation processes. In an example, the oxidation is performed under a lower temperature in a range between about 950° C. to about 1150° C., which is lower than the oxidation temperature of crystalline silicon. As the oxidation of porous silicon may be controlled such that the upper surfaces 534, 554 of the first and second oxide regions 530OX, 550OX, respectively, may be formed at substantially a same level as the upper surface 544, 124 of the N doped region 540, and the N well 120, respectively. Further, following the shapes or profiles of the P doped regions 530, 550 defined within the N doped region 540, N well 120, the shapes or profiles of the oxide regions 530OX, 550OX may be more variably controlled. That is, the doping processes of the P doped regions 530, 550 may be controlled to achieve the desired shapes and/or profiles of the oxide regions 530OX, 550OX.

With the various controls of the doping processes and/or conditions of the P doped regions 530, 550, the oxide regions 530OX, 550OX may include various shapes and/or profiles. For example, the sidewalls 532, 552 of the oxide regions 530OX, 550OX may be inward-sloped or outward-sloped. The oxide regions 530OX, 550OX may include any number of sidewalls 532, 552, including a single continuous sidewall 532, 552. The lower surface 536, 556 of the oxide regions 530OX, 550OX may be angled with the sidewalls 532, 552, respectively, or may continuously meet the sidewalls 532, 552 as integral continuous surfaces. The upper surfaces 534, 554 of the oxide region 530OX, 550OX may raise up, be substantially coplanar with, or may be lower than the upper surfaces 544, 124 of the N doped region 540, and the N well 120.

Processes similar to those shown in FIGS. 5A-5F may also be used to make the example structure 200 of FIGS. 2A and 2B, or similar structures. For example, referring to FIG. 5C, in an embodiment, the N doped region 540 may be formed partially within the first P doped region 530 and partially beyond the first P doped region 530. Referring to FIG. 5D, in an embodiment, the second P doped region 550 may be formed partially within the N doped region 540 and partially beyond the N doped region 540. Then the structure 200 of FIGS. 2A and 2B may be achieved using the similar porous silicon oxidation processes as illustrated in FIGS. 5E and 5F.

Figure 6A:
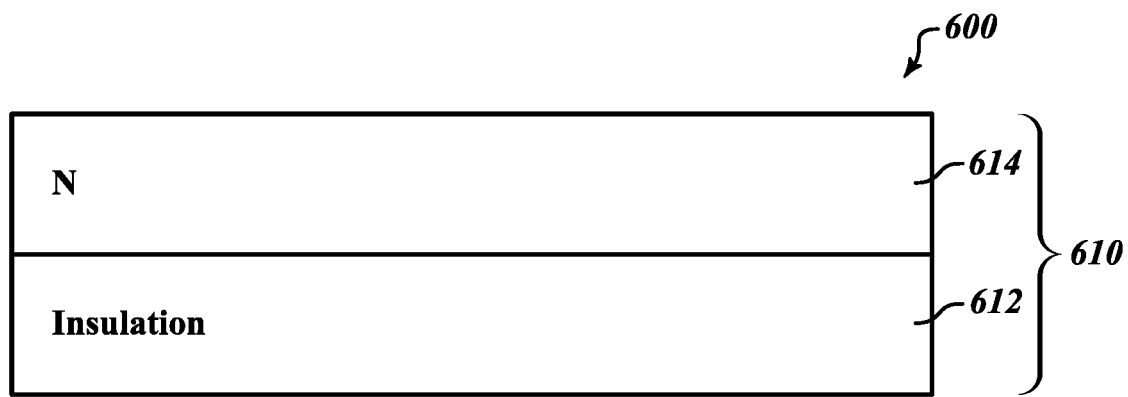
FIGS. 6A-6F show another example process according to the disclosure.

FIGS. 6A-6F show an example process to make oxide regions of various depths. Referring to FIG. 6A, an example wafer 600 is provided. The example wafer 600 may include substrate region 610 that includes an insulation layer 612 and an epitaxial silicon layer 614 over the insulation layer 612. The substrate region 610 may be a silicon-on-insulator substrate or may be a portion of a substrate that is previously processed to form the insulation layer 612. FIG. 6A shows that the insulation layer 612 is a horizontally oriented layer, which is not limiting. The insulating layer 612 may also include vertically oriented portions. In an embodiment, the insulation layer 612 is silicon oxide. The epitaxial silicon layer 614 may be an example N doped silicon layer. In an example, the N doped silicon layer 614 is lightly doped. In the description herein, the N doped epitaxial substrate layer 614 is referred to as "N substrate 614" for descriptive purposes.

Figure 6B:
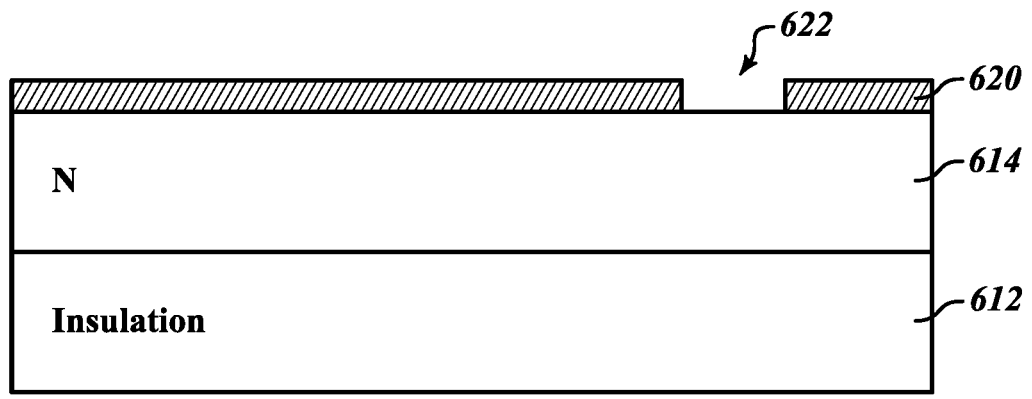

Referring to FIG. 6B, a mask layer 620 is formed over the substrate 610, and patterned to expose a first aperture 622. The mask layer 620 may be one or more of silicon dioxide ("SiO$_2$") or silicon nitride ("SiN") or other suitable dielectric materials. The patterning may by performed using photolithography and etching or other suitable patterning processes.

Figure 6C:
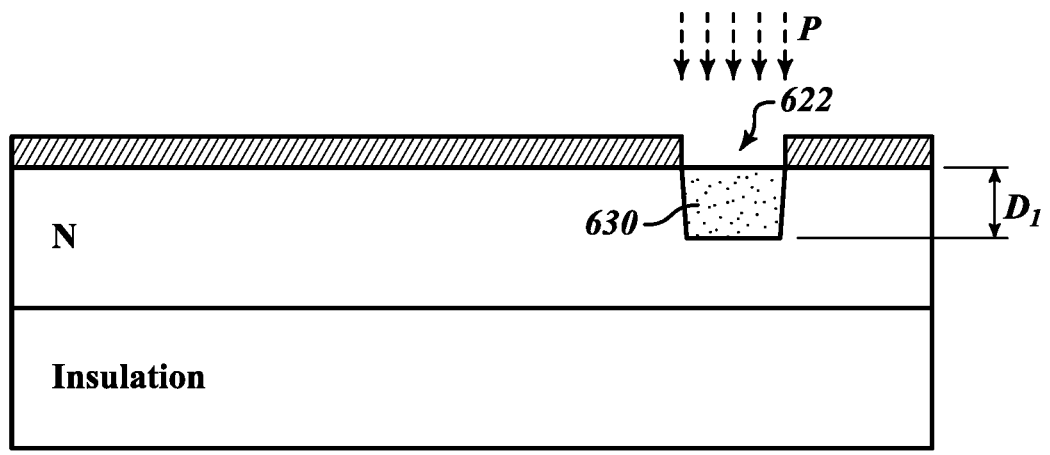

Referring to FIG. 6C, a first P doped region 630 is formed below the first aperture 622. The first P doped region 630 may be formed via ion implantation to introduce P type dopants/impurities, e.g., boron, into the N substrate 614 through the first aperture 622. Other doping techniques are also possible and included in the disclosure. The doping process is controlled such that the first P doped region 630 extends to a first depth D1 within the N substrate 614.

Figure 6D:
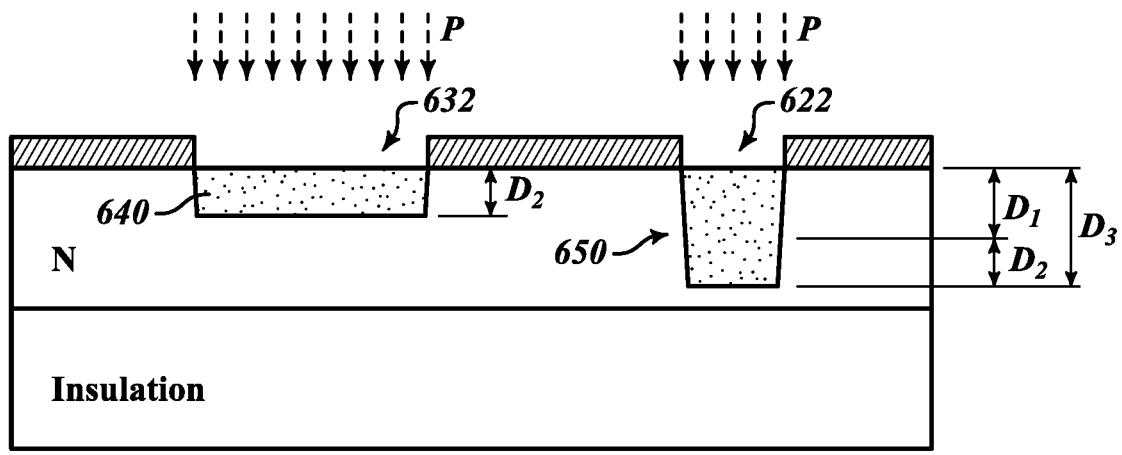

Referring to FIG. 6D, the mask layer 620 is further patterned to form a second aperture 632. A doping process of P type dopants or impurities, e.g., boron, may be performed through the second aperture 632 and the first aperture 622. A second P doped region 640 is, thus, formed below the second aperture 632 with a second depth D2. The first P doped region 630 (not shown in FIG. 6D) is, thus, extended deeper to a third depth D3, and is referred to as a third P doped region 650 to differentiate from the first P doped region 630 with the first depth D1 as shown in FIG. 6C. The third depth D3 is deeper than the first depth D1 or the second depth D2. In an embodiment, the third depth D3 is substantially equal to an addition of the first depth D1 and the second depth D2, i.e., D3=D1+D2.

An annealing process may be performed to activate the dopants in the second P doped region 640 and the third P doped region 650.

FIGS. 6B-6D illustrate one example process of forming a plurality of P doped regions with various depths within a substrate, which do not limit the scope of the disclosure. Other techniques to form a plurality of P doped regions with various depths within a substrate are also possible and included in the disclosure.

Figure 6E:
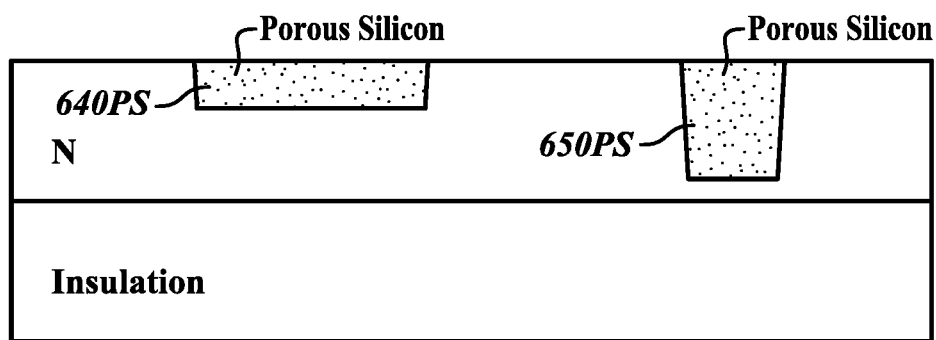

Referring to FIG. 6E, porous silicon is formed in the second P doped region 640 and the third P doped region 650. In an embodiment, substantially the whole second P doped region 640 and the whole third P doped region 650 are converted into porous silicon using anodization, and are referred to as first porous silicon region 640PS and second porous silicon region 650PS.

Figure 6F:
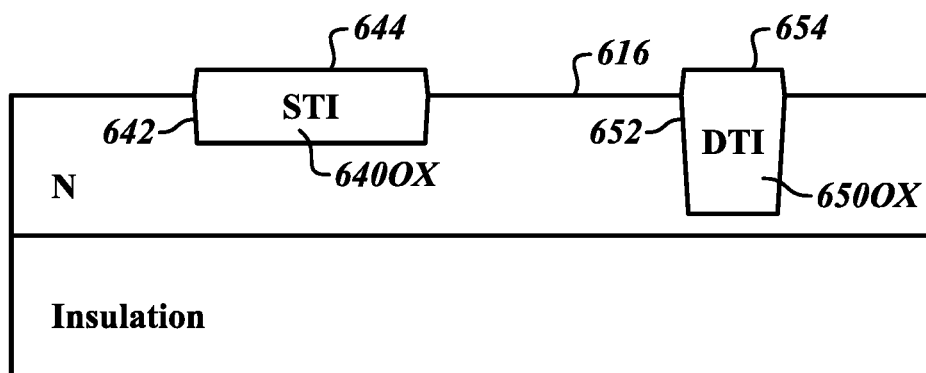

Referring to FIG. 6F, an oxidation process is performed to convert the porous silicon in the first and second porous silicon regions 640PS, 650PS. Depending on the oxidation conditions, the resultant first and second oxide region 640OX, 650OX may have various shapes or profiles, which are controllable under the desired design or device parameters. For example, upper surfaces 644, 654 of the first and second oxide regions 640OX, 650OX, respectively, may be higher than, lower than, or substantially at a same level as the upper surface 616 of the N substrate 614. The sidewalls 642, 652 of the first and second oxide regions 640OX, 650OX may be inward-sloped, outward-sloped, or substantially vertical. The shapes and/or profiles of the first oxide region 640OX or the second oxide region 650OX may be structured by controlling the shapes and/or profiles of the second P doped region 640 or the third P doped region 650.

The structures 100, 200 of FIGS. 1A, 1B and 2A, 2B, and the structure of FIG. 6F and the respective portions thereof may be combined in various manners or incorporated in various semiconductor device structures to achieve distinctive and new structures.

Figure 7:
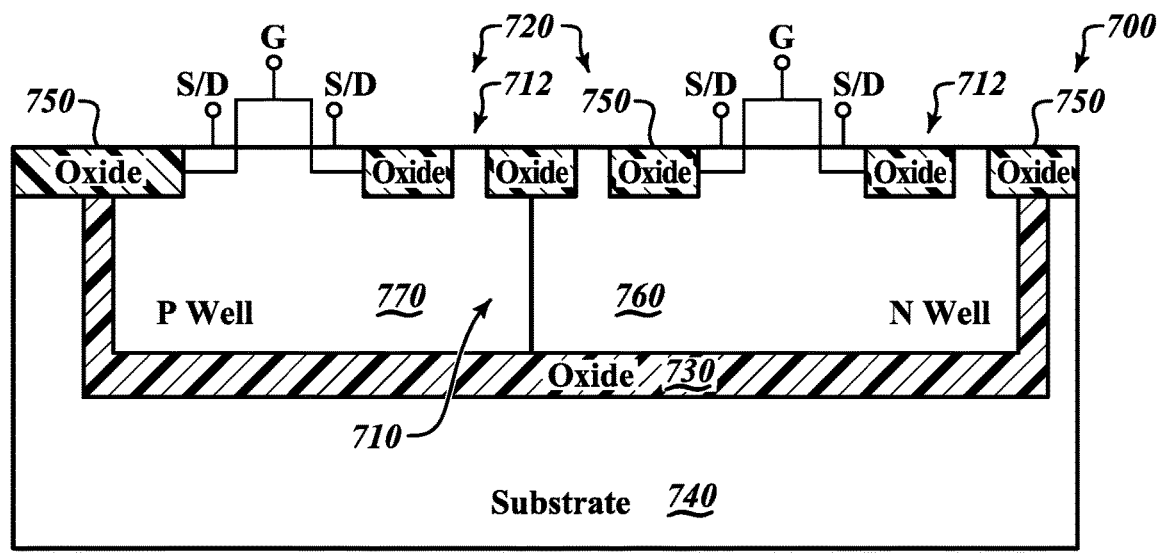
FIG. 7 shows a cross-sectional view of a first example device according to the disclosure.

For example, with reference to FIG. 7, an example structure 700 includes a dielectrically isolated region 710 where a circuitry unit 720 is positioned. An oxide region 730 surrounds the dielectrically isolated region 710 on all surfaces or sidewalls thereof except the upper surface 712 of the dielectrically isolated region 710. That is, the oxide region 730 isolates and/or insulates the dielectrically isolated region 710 from the substrate 740 below, e.g., of silicon, and other devices nearby (not shown, for simplicity). The oxide region 730 helps achieve the advantages of a silicon on insulator (SOI) substrate in a traditional silicon substrate, which makes the silicon on chip (SOC) design more flexible and feasible, especially in the bipolar-CMOS-DMOS (BCD) technologies where analog devices and digital devices co-exist.

The oxide region 730 may be formed using the processes described herein, e.g., those shown in FIGS. 5A-5F. Surface oxide features 750, configured as STI and/or DTI, may be formed on the surface 712 of the dielectrically isolated region 710 and may be made by the processes shown in FIGS. 6A-6F. The surface oxide features 750 may be formed later than or together with the oxide region 730.

The N well 760 may be formed similarly to the N doped region 140 of FIG. 1B. The P well 770 may be formed after the formation of the oxide regions 730, 750 by doping. For example, the P well 770 may be formed within the N doped region 140 of FIG. 1B by counter-doping of P type impurities.

FIG. 7 shows, as an illustrative example, that the devices formed on the dielectrically isolated region 710 are CMOS devices, which is not limiting. In an embodiment, a mixed signal SOC device, e.g., a BCD device, may include the structure 700 where a digital device(s) and analog device(s) each exists in a separate dielectrically isolated region 710 that is surrounded by a respective oxide region 730. The oxide region 730 ensures that the charge carrier movements or channel currents are restrained within the isolated region 710. As such, it is more flexible in circuit design and fabrication design to integrate different types of devices, e.g., low voltage digital devices and high voltage analog devices, within a same die of an SOC device.

Figure 8:
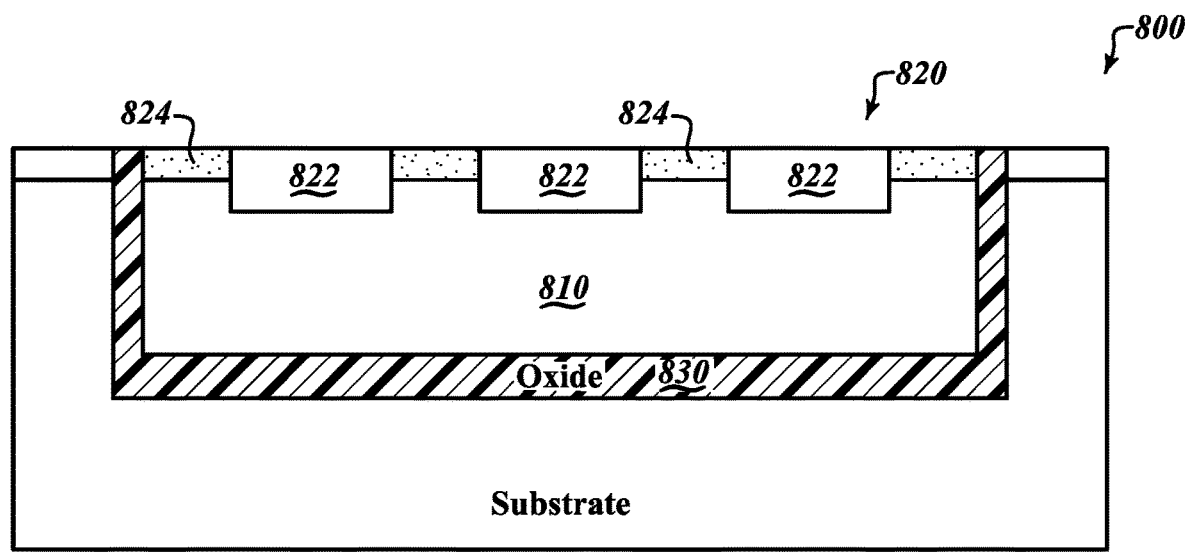
FIG. 8 shows a cross-sectional view of a second example device according to the disclosure.

For example, FIG. 8 illustrates an example structure 800 where a resistive voltage divider device 820 including a plurality of resistive elements 822 ("resistor devices") is formed in and over a dielectrically isolated region 810 surrounded by an oxide insulating region 830. The resistive elements 822 may be separated from one another by local oxide regions 824. The resistive element 822 may be formed through any approaches, which are all included in the disclosure.

The oxide region 830 may be formed using the processes described herein, e.g., those shown in FIGS. 5A-5F. The resistive elements 822 may be formed within the N doped region 140 of FIG. 1A, 1B. Interconnection features may be formed as a BEOL process to couple the plurality of resistive elements 822 in series and/or to couple the resistive elements to other circuitry portions (not shown, for simplicity).

Figure 9A:
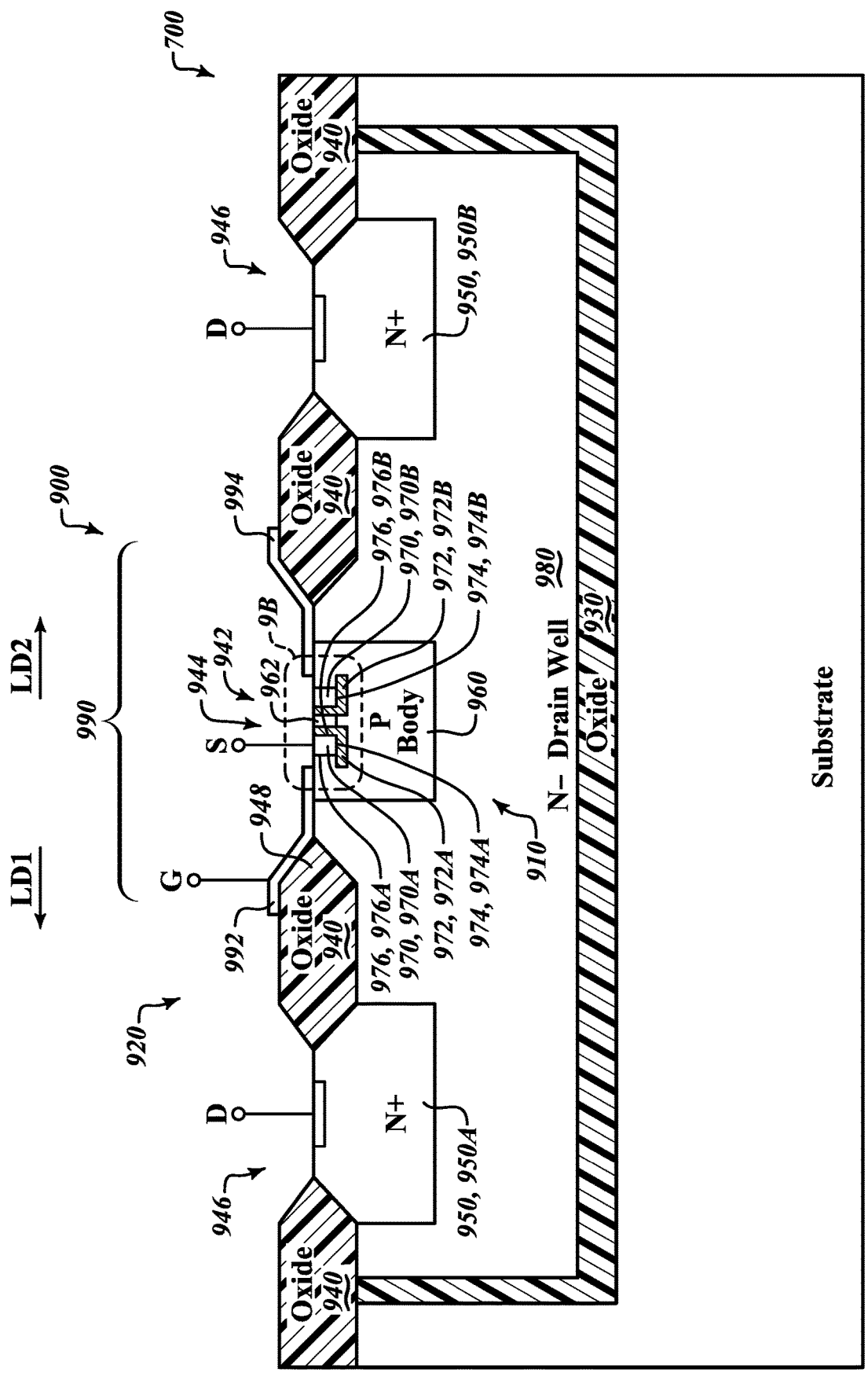
FIGS. 9A and 9B show a sectional view of a third example device according to the disclosure.
Figure 9B:
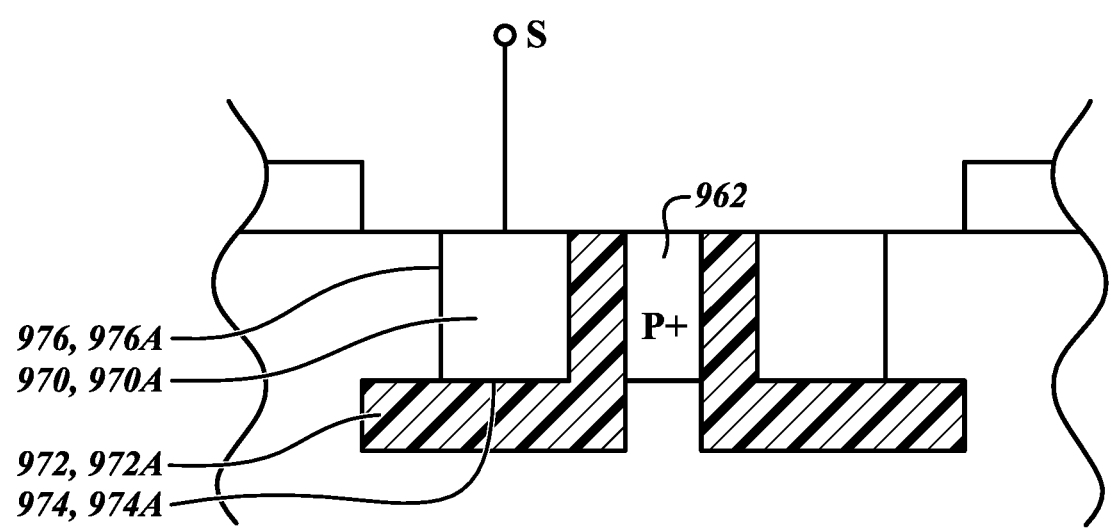

FIG. 9A shows another example structure 900. FIG. 9B shows in an enlarged view a portion 9B of the structure 900. Referring to FIGS. 9A and 9B together, an example lateral double diffused MOS device 920 is formed within a dielectrically isolated region 910 surrounded by an oxide insulating region 930. In an embodiment, the oxide insulating region 930 is cup-shaped or U-shaped in cross-section.

A plurality of surface oxide regions 940 are on the dielectrically isolated region 910. Ends of the oxide region 930 terminate in or abut ones of the plurality of surface oxide regions 940. Other ones of the plurality of surface oxide regions 940 surround a first opening 942 adjacent to an active area 944 and two second openings 946 where drain regions 950 (950A, 950B), e.g., of $N^+$ type, are formed. A body region 960, e.g., of P type, is formed in the active area 944 and houses a body contact region 962, e.g., of $P^+$ type, and a source region 970, e.g., of $N^+$ type. The body region 960 and the drain regions 950 are housed within a drain well 980, e.g., of $N^-$ type.

A gate structure 990 is formed partly on the bird's beak-shaped portion 948 of the surface oxide layer 940, partly on top of the active area 944 and over at least a part of the body region 960 that contacts the source region 970.

The gate structure 990 may be divided into two parts extending at short distances but electrically isolated, which may be configured or structured to be a gate region 992 (shown on the left side for illustration purposes only), and a non-operative region 994 (shown on the right side for illustration purposes only).

The source region 970 is partially surrounded by an oxide layer 972 formed adjacent to the source region 970 and separating the source region 970 and the body region 960, at least partially, by a lower surface 974 of the source region 970 and a sidewall 976 of the source region 970. In an embodiment, the oxide layer 972 surrounds the source region 970 in a manner that the source region 970 only contacts the body region 960 with a small portion of the sidewall 976 of the source region 970.

In an embodiment, as shown in FIG. 9A, the source region 970 includes two doped regions 970A, 970B of the $N^+$ type. The two doped regions 970A, 970B are separated at least by the oxide layer 972.

In an embodiment, the oxide layer 972 includes two portions 972A, 972B, each adjacent to a respective one of the two doped regions 970A, 970B of the source region 970. The $P^+$ body contact region 962 is formed between the two doped portions 972A, 972B of the oxide layer 972.

Each of the oxide portions 972A, 972B fully overlaps the lower surface 974A, 974B of the respective one of the doped regions 970A, 970B such that the lower surfaces 974A, 974B of the doped regions 970A, 970B do not contact the body region 960. The oxide portions 972A, 972B each surrounds the sidewalls 976A, 976B of the respective one of the doped regions 970A, 970B such that the doped region 972A contacts the body region 960 only in a first lateral direction LD1 toward the drain region 950A, and the doped region 972B contacts the body region 960 only in a second lateral direction LD2 toward the drain region 950B. The first lateral direction LD1 and the second lateral direction LD2 lead away from one another.

Figure 10A:
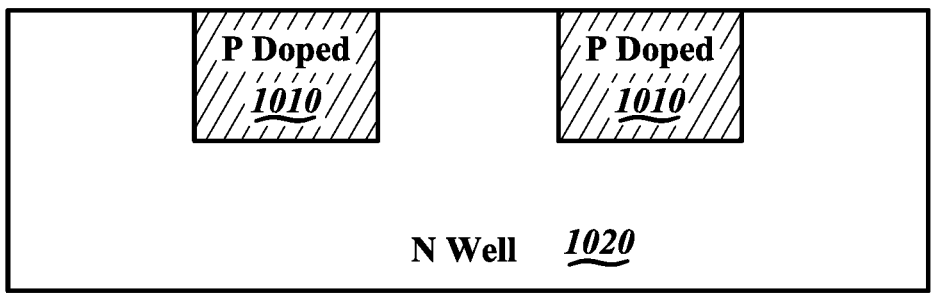
FIGS. 10A-10F show an example process to make a portion of the third example device of FIG. 9A.

FIGS. 10A-10F show an example process of making the oxide layer 972, the source region 970, and the body region 960. Referring to FIG. 10A, two P doped regions 1010 are formed within an N type well 1020 of silicon.

Figure 10B:
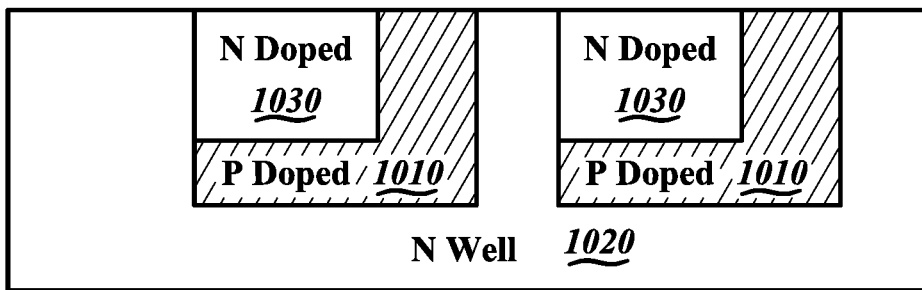

Referring to FIG. 10B, two N doped regions 1030 are each formed partially within the P doped regions 1010, e.g., by counter-doping.

Figure 10C:
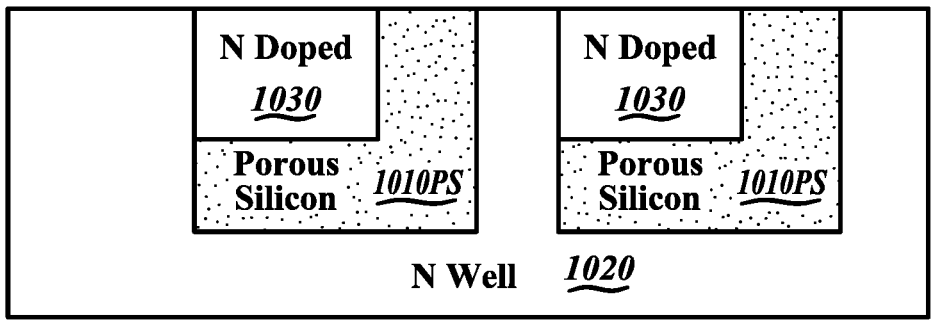

Referring to FIG. 10C, the remaining P doped regions 1010 are anodized to form porous silicon regions 1010PS.

Figure 10D:
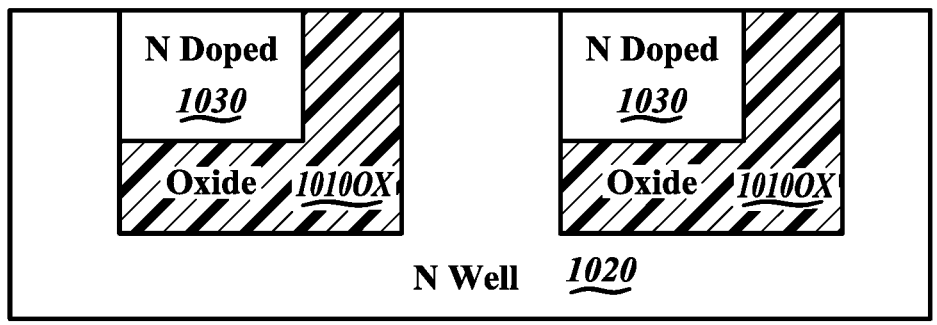

Referring to FIG. 10D, the porous silicon regions 1010PS are oxidized to form oxide regions 1010OX.

Figure 10E:
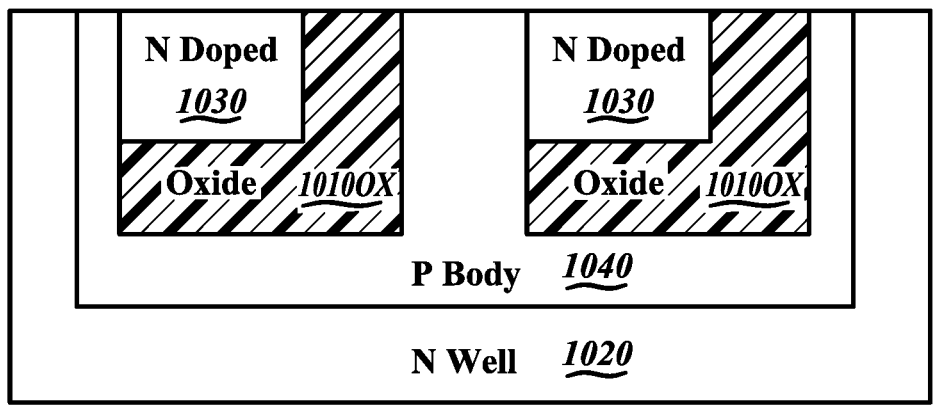

Referring to FIG. 10E, a body region 1040 is formed adjacent to and below the oxide regions 1010OX. Note that in the formation of the body region 1040, a portion of the N doped regions 1030 may be converted into P doped regions, as shown in dotted line in FIG. 10E.

Figure 10F:
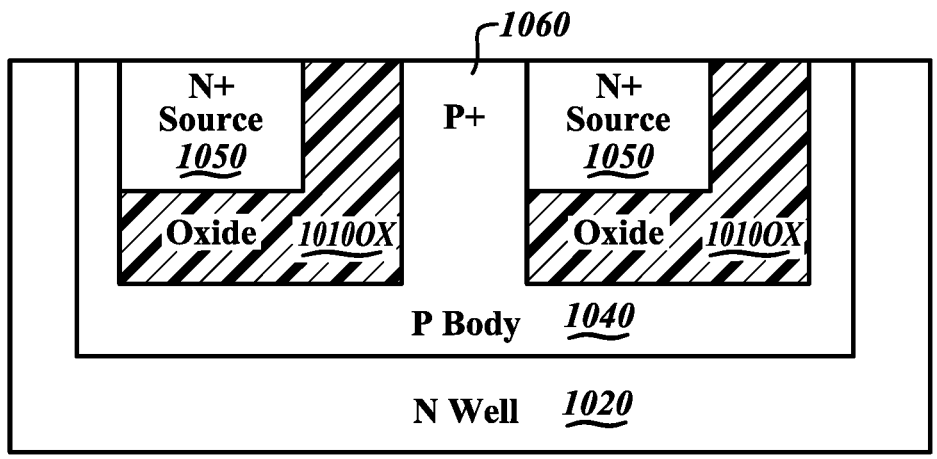

Referring to FIG. 10F, source regions 1050 and body contact region 1060 are formed by doping within and over the body region 1040. The source regions 1050 are each partially surrounded by respective ones of the oxide regions 1010OX. The body contact region 1060 is formed between the two oxide regions 1010OX.

It is clear that numerous modifications and variations may be made to the device described and illustrated, all falling within the scope of the disclosure, as defined in the appended claims.

The formation of the insulating oxide region 930 and the surface oxide regions 940 may be implemented using techniques described herein, e.g., as shown in FIGS. 3A-3F and FIGS. 6A-6F.

The disclosure may be further understood based on the below clauses:

Clause 1: a lateral double-diffused metal-oxide-semiconductor (DMOS) transistor, comprising: a substrate; a first oxide layer formed on a surface of the substrate; a body region of a first conductivity type; a first drain region and a second drain region each of a second conductivity type, the first drain region adjacent to a first side of the body region and the second drain region adjacent to a second side of the body region, each of the first and second drain regions separated on the surface of the substrate by the first oxide layer; a source region of the second conductivity type buried in the body region; a second oxide layer formed adjacent to the source region and separating the source region and the body region by a surface of the source region and at least a portion of a sidewall of the source region; and a conductive gate adjacent to the body region and partially overlaying the first oxide layer.

Clause 2: the lateral DMOS transistor of clause 1, wherein the source region includes two doped regions of the second conductivity type, the two doped regions being separated at least by the second oxide layer.

Clause 3: the lateral DMOS transistor of clause 2, wherein the second oxide layer includes two oxide regions each adjacent to one of the two doped regions of the source region, respectively.

Clause 4: the lateral DMOS of clause 2, wherein a first doped region of the two doped regions contacts the body region in a first lateral direction toward the first drain region and a second doped region of the two doped regions contacts the body region in a second lateral direction toward the second drain region.

Clause 5: the lateral DMOS transistor of clause 1, wherein the second oxide layer fully overlaps the surface of the source region.

Clause 6: the lateral DMOS transistor of clause 1, further comprising a third oxide layer below the body region, the first drain region and the second drain region.

Clause 7: the lateral DMOS transistor of clause 6, wherein the third oxide layer extends upward to the surface of the substrate and defines a dielectrically insulated region for the lateral DMOS transistor.

Clause 8: the lateral DMOS transistor of clause 7, wherein the third oxide layer is cup-shaped.

Clause 9: a structure, comprising: a substrate; an oxide layer defining a semiconductor region within the substrate, the semiconductor region adjacent to the oxide layer by a bottom surface and a sidewall of the semiconductor region; and a semiconductor device formed within the semiconductor region.

Clause 10: the structure of clause 9, wherein the semiconductor device includes two semiconductor devices each configured as a resistor.

Clause 11: the structure of clause 9, wherein the semiconductor device includes an NMOS transistor and a PMOS transistor.

Clause 12: a method, comprising: forming a first P doped region within a substrate; forming a first N doped region buried within the first P doped region except for a top surface of the N doped region; forming porous silicon in the first P doped region by anodizing the first P doped region; forming a first silicon oxide region by oxidizing the porous silicon in the P doped region; and forming a second P doped region within the first N doped region.

Clause 13: the method of clause 12, further comprising forming an NMOS in the second P doped region and forming a PMOS transistor adjacent to the NMOS transistor and within the first N doped region.

Clause 14: the method of clause 12, further comprising: forming a third P doped region buried within the first N doped region, the third P doped region including a first side and a second side; forming a second N doped region and a third N dope region by counter-doping the third P doped region, each of the second N doped region and the third N dope region partially overlaying the third P doped region and having a side exposed from the third P doped region, the second N doped region and the third N dope region being separated from one another by the third P doped region; forming porous silicon in the third P doped region by anodizing the third P doped region; and forming a second silicon oxide region by oxidizing the porous silicon in the third P doped region.

Clause 15: the method of clause 14, further comprising forming a fourth P doped region adjacent to the second N doped region and the third N doped region and a remaining part of the third P doped region.

Clause 16: a method, comprising: forming a first P doped region within a substrate; forming a first N doped region buried within the first P doped region except for a top surface of the N doped region; forming porous silicon in the first P doped region by applying an electrical field on the first P doped region; forming a first silicon oxide region by oxidizing the porous silicon in the first P doped region; and forming a resistor device within the first N doped region.

Clause 17: the method of clause 16, wherein the forming a resistor device includes forming a plurality of resistor devices within the first N doped region.

Clause 18: the method of clause 17, further comprising forming an interconnection to couple the plurality of resistor devices in series.

The invention claimed is:

1. A structure, comprising:
    a substrate including a first N type semiconductor region;
    a first insulation region at least partially embedded within the first N type semiconductor region and with a first surface of the first insulation region exposed from the first N type semiconductor region;
    a second N type semiconductor region over the first insulation region, the first insulation region adjacent to a first surface of the second N type semiconductor region and at least partially surrounding a first sidewall of the second N type semiconductor region; and
    a second insulation region over the second N type semiconductor region, the second N type semiconductor region adjacent to a first surface of the second insulation region and at least partially surrounding a sidewall of the second insulation region.

2. The structure of claim 1, wherein the first insulation region is adjacent to a second sidewall of the second N type semiconductor region that is opposite to the first sidewall.

3. The structure of claim 1, wherein the first insulation region fully surrounds the second N type semiconductor region except for a second surface of the second N type semiconductor region.

4. The structure of claim 1, wherein the second N type semiconductor region fully surrounds the second insulation region except for a second surface of the second insulation region.

5. The structure of claim 1, wherein the first insulation region includes silicon oxide.

6. The structure of claim 5, wherein the first insulation region includes porous silicon.

7. The structure of claim 5, wherein the first insulation region includes P conductivity type ions.

8. The structure of claim 1, wherein the second N type semiconductor region has a first portion that overlaps the first insulation region and a second portion that extends laterally beyond the first insulation region.

9. A lateral double-diffused metal-oxide-semiconductor (DMOS) transistor, comprising:
    a substrate;
    a first oxide layer formed on a surface of the substrate;
    a body region of a first conductivity type;
    a first drain region and a second drain region each of a second conductivity type, the first drain region adjacent to a first side of the body region, the second drain region adjacent to a second side of the body region, each of the first and second drain regions separated on the surface of the substrate by the first oxide layer;
    a source region of the second conductivity type buried in the body region;
    a second oxide layer formed adjacent to a surface of the source region and at least a portion of a sidewall of the source region, the second oxide layer separating the source region from the body region; and
    a conductive gate adjacent to the body region and partially overlaying the first oxide layer.

10. The lateral DMOS transistor of claim 9, wherein the source region includes two doped regions of the second conductivity type, the two doped regions being separated at least by the second oxide layer.

11. The lateral DMOS transistor of claim 10, wherein the second oxide layer includes two oxide regions each adjacent to one of the two doped regions of the source region, respectively.

12. The lateral DMOS of claim 10, wherein a first doped region of the two doped regions contacts the body region in a first lateral direction toward the first drain region, and a second doped region of the two doped regions contacts the body region in a second lateral direction toward the second drain region.

13. The lateral DMOS transistor of claim 9, wherein the second oxide layer fully overlaps the surface of the source region.

14. The lateral DMOS transistor of claim 9, further comprising a third oxide layer below the body region, the first drain region and the second drain region.

15. The lateral DMOS transistor of claim 14, wherein the third oxide layer extends upward to the surface of the substrate and defines a dielectrically isolated region for the lateral DMOS transistor.

16. The lateral DMOS transistor of claim 15, wherein the third oxide layer is cup-shaped.

17. A structure, comprising:
    a substrate;
    an oxide layer;
    a semiconductor region within the substrate, the semiconductor region adjacent to the oxide layer at a bottom surface and a sidewall of the semiconductor region; and
    a semiconductor device formed within the semiconductor region.

18. The structure of claim 17, wherein the semiconductor device includes a first resistor and a second resistor.

19. The structure of claim 17, wherein the semiconductor device includes an NMOS transistor and a PMOS transistor.

20. A structure, comprising:
    a substrate including a first N type semiconductor region;
    a first insulation region at least partially embedded within the first N type semiconductor region and with a first surface of the first insulation region exposed from the first N type semiconductor region;
    a second N type semiconductor region over the first insulation region, the first insulation region adjacent to a first surface of the second N type semiconductor region and at least partially surrounding a first sidewall of the second N type semiconductor region;
    wherein the second N type semiconductor region has a first portion that overlaps the first insulation region and a second portion that extends laterally beyond the first insulation region.

* * * * *